(12) United States Patent
McDonnell et al.

(10) Patent No.: US 10,254,021 B2
(45) Date of Patent: Apr. 9, 2019

(54) COOLING SYSTEMS AND METHODS USING TWO COOLING CIRCUITS

(71) Applicant: Inertech IP LLC, Danbury, CT (US)

(72) Inventors: Gerald McDonnell, Poughquag, NY (US); Ming Zhang, Ballwin, MO (US); John Costakis, Hyde Park, NY (US); Earl Keisling, Ridgefield, CT (US)

(73) Assignee: Inertech IP LLC, Plano, TX (US)

( * ) Notice: Subject to any disclaimer, the term of this patent is extended or adjusted under 35 U.S.C. 154(b) by 391 days.

(21) Appl. No.: 14/520,322

(22) Filed: Oct. 21, 2014

(65) Prior Publication Data

US 2015/0176865 A1 Jun. 25, 2015

Related U.S. Application Data

(60) Provisional application No. 61/893,848, filed on Oct. 21, 2013.

(51) Int. Cl.
*H05K 7/20* (2006.01)
*F25B 29/00* (2006.01)

(52) U.S. Cl.
CPC ....... *F25B 29/003* (2013.01); *H05K 7/20827* (2013.01); *F25B 2339/047* (2013.01)

(58) Field of Classification Search
CPC ............... H05K 7/208; H05K 7/20763; H05K 7/20627; H05K 7/20827; F25B 6/02; F25B 25/005; F25B 29/003; F25B 2339/047; F25B 40/02
See application file for complete search history.

(56) References Cited

U.S. PATENT DOCUMENTS

| | | | |
|---|---|---|---|
| 4,270,358 A * | 6/1981 | Husain | F01K 9/003 165/104.25 |
| 5,715,693 A | 2/1998 | van der Walt et al. | |
| 6,116,048 A | 9/2000 | Hebert | |
| 6,374,627 B1 | 4/2002 | Schumacher et al. | |
| 6,574,104 B2 | 6/2003 | Patel et al. | |
| 6,640,561 B2 | 11/2003 | Roberto | |
| 6,772,604 B2 | 8/2004 | Bash et al. | |
| 6,826,922 B2 | 12/2004 | Patel et al. | |
| 6,859,366 B2 | 2/2005 | Fink | |
| 6,980,433 B2 | 12/2005 | Fink | |
| 7,046,514 B2 | 5/2006 | Fink et al. | |

(Continued)

FOREIGN PATENT DOCUMENTS

| | | |
|---|---|---|
| AU | 2010256688 A1 | 1/2012 |
| CN | 101442893 A | 5/2009 |

(Continued)

OTHER PUBLICATIONS

HP Modular Cooling System Site Preparation Guide, 2006-2007, <http://h20565.www2.hp.com/hpsc/doc/public/display?docId=emr_na-c00613691>.

(Continued)

*Primary Examiner* — David Teitelbaum
*Assistant Examiner* — Schyler S Sanks
(74) *Attorney, Agent, or Firm* — Weber Rosselli & Cannon LLP

(57) ABSTRACT

The cooling systems and methods of the present disclosure relate to cooling electronic equipment in data centers or any other applications that have high heat rejection temperature and high sensible heat ratio.

10 Claims, 3 Drawing Sheets

(56) References Cited

U.S. PATENT DOCUMENTS

| | | |
|---|---|---|
| 7,106,590 B2 | 9/2006 | Chu et al. |
| 7,173,820 B2 | 2/2007 | Fink et al. |
| 7,406,839 B2 | 8/2008 | Bean et al. |
| 7,418,825 B1 | 9/2008 | Bean, Jr. |
| 7,477,514 B2 | 1/2009 | Campbell et al. |
| 7,569,954 B2 | 8/2009 | Tolle et al. |
| 7,660,116 B2 | 2/2010 | Claassen et al. |
| 7,660,121 B2 | 2/2010 | Campbell et al. |
| 7,684,193 B2 | 3/2010 | Fink et al. |
| 7,730,731 B1 | 6/2010 | Bash et al. |
| 7,738,251 B2 | 6/2010 | Clidaras et al. |
| 7,804,687 B2 | 9/2010 | Copeland et al. |
| 7,855,890 B2 | 12/2010 | Kashirajima et al. |
| 7,864,527 B1 | 1/2011 | Whitted |
| 7,881,057 B2 | 2/2011 | Fink et al. |
| 7,903,404 B2 | 3/2011 | Tozer et al. |
| 7,903,409 B2 | 3/2011 | Patel et al. |
| 7,907,406 B1 | 3/2011 | Campbell et al. |
| 7,957,144 B2 | 6/2011 | Goettert et al. |
| 7,963,119 B2 | 6/2011 | Campbell et al. |
| 8,000,103 B2 | 8/2011 | Lipp et al. |
| 8,031,468 B2 | 10/2011 | Bean, Jr. et al. |
| 8,118,084 B2 | 2/2012 | Harvey |
| 8,120,916 B2 | 2/2012 | Schmidt et al. |
| 8,146,374 B1 | 4/2012 | Zien |
| 8,184,435 B2 | 5/2012 | Bean, Jr. et al. |
| 8,189,334 B2 | 5/2012 | Campbell et al. |
| 8,199,504 B2 | 6/2012 | Kashirajima et al. |
| 8,208,258 B2 | 6/2012 | Campbell et al. |
| 8,218,322 B2 | 7/2012 | Clidaras et al. |
| 8,261,565 B2 | 9/2012 | Borror et al. |
| 8,289,710 B2 | 10/2012 | Spearing et al. |
| 8,297,069 B2 | 10/2012 | Novotny et al. |
| 8,320,125 B1 | 11/2012 | Hamburgen et al. |
| 8,351,200 B2 | 1/2013 | Arimilli et al. |
| 8,387,687 B2 | 3/2013 | Baer |
| 8,392,035 B2 | 3/2013 | Patel et al. |
| 8,405,977 B2 | 3/2013 | Lin |
| 8,432,690 B2 | 4/2013 | Fink et al. |
| 8,456,840 B1 | 6/2013 | Clidaras et al. |
| 8,457,938 B2 | 6/2013 | Archibald et al. |
| 8,472,182 B2 | 6/2013 | Campbell et al. |
| 8,514,575 B2 | 8/2013 | Goth et al. |
| 8,583,290 B2 | 11/2013 | Campbell et al. |
| 8,689,861 B2 | 4/2014 | Campbell et al. |
| 8,760,863 B2 | 6/2014 | Campbell et al. |
| 8,763,414 B2 | 7/2014 | Carlson et al. |
| 8,780,555 B2 | 7/2014 | Fink et al. |
| 8,783,052 B2 | 7/2014 | Campbell et al. |
| 8,797,740 B2 | 8/2014 | Campbell et al. |
| 8,813,515 B2 | 8/2014 | Campbell et al. |
| 8,817,465 B2 | 8/2014 | Campbell et al. |
| 8,817,474 B2 | 8/2014 | Campbell et al. |
| 8,824,143 B2 | 9/2014 | Campbell et al. |
| 8,839,638 B2 | 9/2014 | Kashirajima et al. |
| 8,867,204 B1 | 10/2014 | Gardner |
| 8,879,257 B2 | 11/2014 | Campbell et al. |
| 2002/0172007 A1 | 11/2002 | Pautsch |
| 2003/0061824 A1 | 4/2003 | Marsala |
| 2007/0227710 A1 | 10/2007 | Belady et al. |
| 2009/0086428 A1 | 4/2009 | Campbell et al. |
| 2009/0154096 A1 | 6/2009 | Iyengar et al. |
| 2010/0032142 A1 | 2/2010 | Copeland et al. |
| 2010/0136895 A1 | 6/2010 | Sgro |
| 2010/0300650 A1 | 12/2010 | Bean, Jr. |
| 2011/0198057 A1 | 8/2011 | Lange et al. |
| 2011/0265983 A1 | 11/2011 | Pedersen |
| 2011/0313576 A1 | 12/2011 | Nicewonger |
| 2012/0103591 A1 | 5/2012 | Tozer |
| 2012/0125028 A1* | 5/2012 | Keisling ............ H05K 7/20827 62/228.1 |
| 2012/0174612 A1 | 7/2012 | Madara et al. |
| 2015/0059379 A1* | 3/2015 | Ootani .................. F25B 29/003 62/190 |

FOREIGN PATENT DOCUMENTS

| | | |
|---|---|---|
| CN | 100584168 C | 1/2010 |
| CN | 101686629 A | 3/2010 |
| CN | 102334396 A | 1/2012 |
| CN | 102461357 A | 5/2012 |
| DE | 102012218873 A1 | 5/2013 |
| EP | 1604263 A2 | 12/2005 |
| JP | 2008287733 A | 11/2008 |
| JP | 5113203 B2 | 1/2013 |
| JP | 5209584 B2 | 6/2013 |
| JP | 5243929 B2 | 7/2013 |
| JP | 5244058 B2 | 7/2013 |
| JP | 5301009 B2 | 9/2013 |
| JP | 5308750 B2 | 10/2013 |
| JP | WO 2013145406 A1 * | 10/2013 ............ F25B 29/003 |

OTHER PUBLICATIONS

Air-Cooled High-Performance Data Centers: Case Studies and Best Methods, 2006, <http://www.intel.in/content/dam/www/public/us/en/documents/white-papers/date-center-efficiency-air-cooled-bkms-paper.pdf>.

Liebert Xtreme Density—System Design Manual, 2009, <http://shared.liebert.com/SharedDocuments/LiebertFiles/SL_16655_REV09_07-09.pdf>.

Data Center Evolution A Tutorial on State of the Art, Issues, and Challenges, 2009, <http://www.cse.iitb.ac.in/~puru/courses/autumn12/cs695/downloads/dcevolve.pdf>.

Weatherman: Automated, Online, and Predictive Thermal Mapping and Management for Data Centers, 2006, <http://www.cse.iitb.ac.in/~puru/courses/spring14/cs695/downloads/weatherman.pdf>.

Reduced-Order Modeling of Multiscale Turbulent Convection: Application to Data Center Thermal Management, May 2006, <https://smartech.gatech.edu/bitstream/handle/1853/14605/rambo_jeffrey_200605_phd.pdf>.

* cited by examiner

COOLING SYSTEMS AND METHODS USING TWO COOLING CIRCUITS

BACKGROUND

Conventional cooling systems do not exhibit significant reductions in energy use in relation to decreases in load demand. Air-cooled direct expansion (DX), water-cooled chillers, heat pumps, and even large fan air systems do not scale down well to light loading operation. Rather, the energy cost per ton of cooling increases dramatically as the output tonnage is reduced on conventional systems. This has been mitigated somewhat with the addition of fans, pumps, and chiller variable frequency drives (VFDs); however, their turn-down capabilities are still limited by such issues as minimum flow constraints for thermal heat transfer of air, water, and compressed refrigerant. For example, a 15% loaded air conditioning system requires significantly more than 15% power of its 100% rated power use. In most cases such a system requires as much as 40-50% of its 100% rated power use to provide 15% of cooling work.

Conventional commercial, residential, and industrial air conditioning cooling circuits require high electrical power draw when energizing the compressor circuits to perform the cooling work. Some compressor manufacturers have mitigated the power in rush and spikes by employing energy saving VFDs and other apparatuses for step loading control functions. However, the current systems employed to perform cooling functions are extreme power users.

Existing refrigerant systems do not operate well under partial or lightly loaded conditions, nor are they efficient at low ambient temperature or "shoulder seasonal" operation in cooler climates. These existing refrigerant systems are generally required to be fitted with low ambient kits in cooler climates, and other energy robbing circuit devices, such as hot gas bypass in order to provide a stable environment for the refrigerant under these conditions.

Compressors on traditional cooling systems rely on tight control of the vapor evaporated in an evaporator coil. This is accomplished by using a metering device (or expansion valve) at the inlet of the evaporator which effectively meters the amount of liquid that is allowed into the evaporator. The expanded liquid absorbs the heat present in the evaporator coil and leaves the coil as a super-heated vapor. Tight metering control is required in order to ensure that all of the available liquid has been boiled off before leaving the evaporator coil. This can create several problems under low loading conditions, such as uneven heat distribution across a large refrigerant coil face or liquid slugging to the compressor. This latter scenario can damage or destroy a compressor.

To combat the inflexibility problems that exist on the low-end operation of refrigerant systems, manufacturers employ hot gas bypass and other low ambient measures to mitigate slugging and uneven heat distribution. These measures create a false load and cost energy to operate.

Conventional air-cooled air conditioning equipment is inefficient. The kw per ton (kilowatt electrical per ton of refrigeration or kilowatt electrical per 3.517 kilowatts of refrigeration) for the circuits are more than 1.0 kw per ton during operation in high dry bulb ambient conditions.

Evaporative assist condensing air conditioning units exhibit better kw/ton energy performance over air-cooled DX equipment. However, they still have limitations in practical operation in climates that are variable in temperature. They also require a great deal more in maintenance and chemical treatment costs.

Central plant chiller systems that temper, cool, and dehumidify large quantities of hot process intake air, such as intakes for turbine inlet air systems, large fresh air systems for hospitals, manufacturing, casinos, hotel, and building corridor supply systems are expensive to install, costly to operate, and are inefficient over the broad spectrum of operational conditions.

Existing compressor circuits have the ability to reduce power use under varying or reductions in system loading by either stepping down the compressors or reducing speed (e.g., using a VFD). There are limitations to the speed controls as well as the steps of reduction.

Gas turbine power production facilities rely on either expensive chiller plants and inlet air cooling systems, or high volume water spray systems as a means to temper the inlet combustion air. The turbines lose efficiency when the entering air is allowed to spike above 59° F. and possess a relative humidity (RH) of less than 60% RH. The alternative to the chiller plant assist is a high volume water inlet spray system. High volume water inlet spray systems are less costly to build and operate. However, such systems present heavy maintenance costs and risks to the gas turbines, as well as consume huge quantities of potable water.

Hospital intake air systems require 100% outside air. It is extremely costly to cool this air in high ambient and high latent atmospheres using the conventional chiller plant systems.

Casinos require high volumes of outside air for ventilation to casino floors. They are extremely costly to operate, and utilize a tremendous amount of water especially in arid environments, e.g., Las Vegas, Nev. in the United States.

Middle eastern and desert environments have a high impact on inlet air cooling systems due to the excessive work that a compressor is expected to perform as a ratio of the inlet condensing air or water versus the leaving chilled water discharge. The higher the delta, the more work the compressor has to perform with a resulting higher kw/ton electrical draw. As a result of the high ambient desert environment, a cooling plant will expend nearly double the amount of power to produce the same amount of cooling in a less arid environment.

High latent load environments, such as in Asia, India, Africa, and the southern hemispheres, require high cooling capacities to handle the effects of high moisture in the atmosphere. The air must be cooled and the moisture must be eliminated in order to provide comfort cooling for residential, commercial, and industrial outside air treatment applications. High latent heat loads cause compressors to work harder and require a higher demand to handle the increased work load.

Existing refrigeration process systems are normally designed and built in parallel. The parallel systems do not operate efficiently over the broad spectrum of environmental conditions. They also require extensive control operating algorithms to enable the various pieces of equipment on the system to operate as one efficiently. There are many efficiencies that are lost across the operating spectrum because the systems are piped, operated, and controlled in parallel.

There have not been many innovations in air conditioning systems and cooling equipment that address the inherent limitations of the various refrigerant cooling processes. Each conventional system exhibits losses in efficiency at high-end, shoulder, and low-end loading conditions. In addition to the non-linear power versus loading issues, environmental conditions have extreme impacts on the individual cooling processes. The conventional systems are too broadly utilized across a wide array of environmental conditions. The results are that most of the systems operate inefficiently for a vast majority of time. The reasons for the inefficiencies are based on operator misuse, misapplication for the environment, or losses in efficiency due to inherent limiting characteristics of the cooling equipment.

DETAILED DESCRIPTION

The present disclosure features a cooling system for data centers or for any other applications that have high heat rejection temperature and high sensible heat ratio compared to general air conditioning or refrigeration applications. The cooling system includes two cooling circuits. The first circuit takes advantage of "free" cooling, where only water evaporation to the outdoors along with fan and pump power are needed for cooling. The second circuit uses vapor compression and refrigerant liquid overfeed type cooling loops including refrigerant-to-refrigerant heat transfer.

Some systems for data center cooling use water-to-refrigerant heat transfer, and, when the outdoor wet-bulb temperature is above approximately 18° C., water (or a glycol solution) is chilled by a chiller loop to cool the refrigerant to the needed temperature. Thus, when the outdoor wet bulb temperature is above approximately 18° C., the system uses a refrigerant-to-water-to-refrigerant heat transfer process. The additional step of heat transfer increases overall energy use because of the approach temperature needed for each step of heat transfer.

The present disclosure eliminates one step of heat transfer by using a refrigerant-to-refrigerant heat transfer process, so that there is no intermediate step to the chilled water. When combined with an additional "free" water cooling circuit, the refrigerant-to-refrigerant heat transfer system can be used for high wet bulb temperature applications while still keeping the free cooling function.

Figure 1:
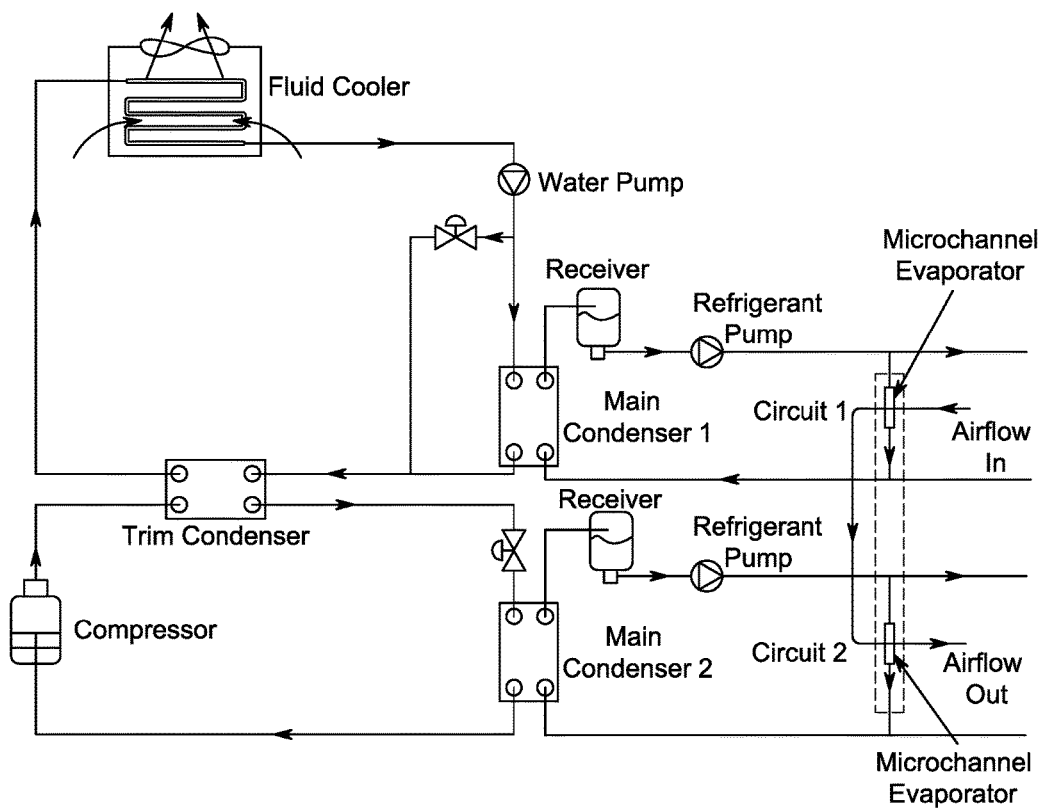
FIG. 1 is a schematic flow diagram of a cooling system in accordance with embodiments of the present disclosure.

FIG. 1 is a schematic flow diagram of a cooling system in accordance with embodiments of the present disclosure. The cooling system of FIG. 1 has two overfed refrigerant circuits. The vapor refrigerant in circuit 1 is condensed by water (or glycol/water mixture) from the evaporative fluid cooler while the vapor refrigerant in circuit 2 is condensed by a compressor loop through a refrigerant-to-refrigerant heat exchanger, which is an evaporator for the compressor loop and a condenser for the pumped refrigerant loop of circuit 2.

The warm air from the electronic equipment (or any other heat source or heat load) flows through the microchannel evaporator of circuit 1, and is cooled to a lower temperature. The air leaving the microchannel evaporator of circuit 1 flows through the microchannel evaporator of circuit 2 and is cooled further. When the outdoor wet bulb temperature is low, the compressor loop and circuit 2 are not needed and are controlled to stop working. In this low ambient mode of operation, the water (or glycol solution) loop and circuit 1 work to provide "free cooling", which is all that is needed to cool. When the outdoor wet bulb temperature is high, the "free cooling" from the water loop and circuit 1 partially cool the warm air from the electronic equipment, and the compressor loop and circuit 2 are controlled to start working to provide additional cooling to further cool the air from the evaporator of circuit 1 to the desired temperature through the evaporator of circuit 2.

Figure 2:
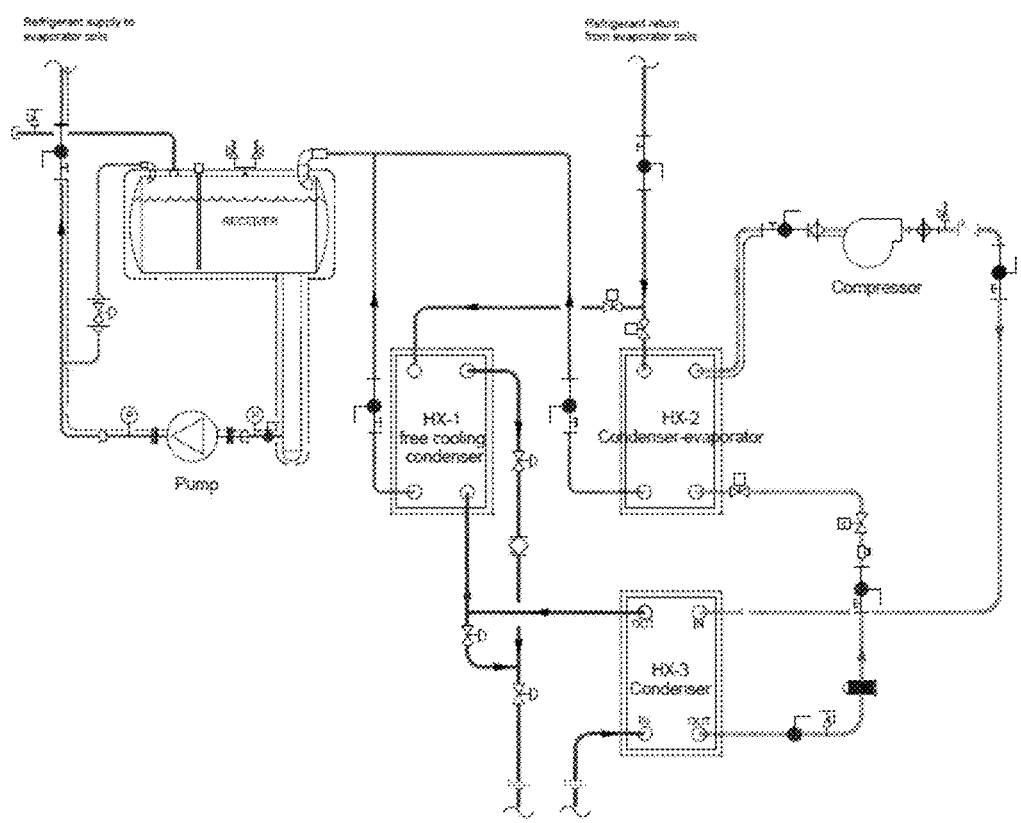
FIG. 2 is a schematic flow diagram of an embodiment of a circuit of the cooling system of FIG. 1.

Depending on specific applications or designs, the system layout may be varied. For example, circuit 2 of FIG. 1 is modified by adding one more plate heat exchanger as shown in FIG. 2 so that circuit 2 has free cooling capability (using water or water/glycol mixture only from the fluid cooler to condense the refrigerant of the overfed pump loop) when the outdoor wet bulb temperature is low. Alternatively, circuit 2 of FIG. 1 is modified by adding connecting pipes and control valves as shown in FIG. 3 to provide free cooling capability for circuit 2.

Figure 3:
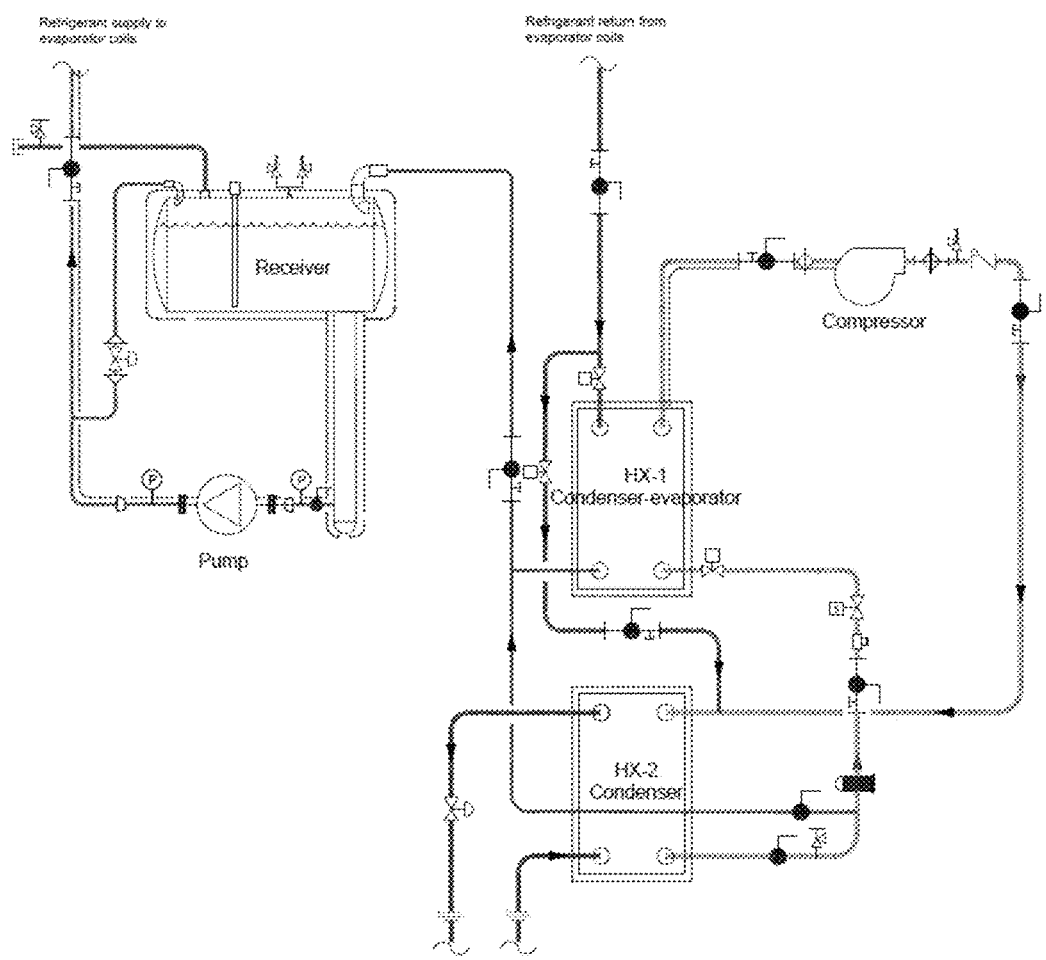
FIG. 3 is a schematic flow diagram of another embodiment of a circuit of the cooling system of FIG. 1.

The circuit shown in FIG. 2 or FIG. 3 can also be used to replace circuit 1 and cooling water in FIG. 1 so that in addition to free cooling, circuit 1 can work with a compressor loop to provide enough cooling when needed.

In one embodiment, a cooling system of the present disclosure includes a first evaporator coil in thermal communication with an air intake flow to a heat load, a first liquid refrigerant distribution unit in thermal communication with the first evaporator coil to form a first fluid circuit, a second evaporator coil disposed in series with the first evaporator coil in the air intake flow and in thermal communication with the air intake flow to the heat load, a second liquid refrigerant distribution unit in thermal communication with the second evaporator coil to form a second fluid circuit, a cooling circuit design described in FIG. 2 and FIG. 3 in thermal communication with the first fluid circuit, and a cooling circuit described in FIG. 2 and FIG. 3 in thermal communication with the second fluid circuit.

The first liquid refrigerant distribution unit includes a cooling water and compressor circuit. The first fluid circuit is primarily in thermal communication with the cooling water for free cooling, but can be in thermal communication with the compressor circuit through a refrigerant-to-refrigerant heat exchanger when needed.

The second liquid refrigerant distribution unit includes a cooling water and compressor circuit. The second fluid circuit is primarily in thermal communication with the compressor circuit through a refrigerant-to-refrigerant heat exchanger, but can be in thermal communication with the cooling water for free cooling when needed.

Although the illustrative embodiments of the present disclosure have been described herein with reference to the accompanying drawings, it is to be understood that the disclosure is not limited to those precise embodiments, and that various other changes and modification may be effected therein by one skilled in the art without departing from the scope or spirit of the disclosure.

Other applications for the cooling system of the present disclosure include turbine inlet air cooling, laboratory system cooling, and electronics cooling, among many others.

What is claimed is:
1. A cooling system comprising:
a first evaporator coil in thermal communication with an air intake flow from a heat load;
a first liquid refrigerant distribution unit coupled to the first evaporator coil to form a first fluid circuit;
a second evaporator coil disposed in series with the first evaporator coil and in thermal communication with an air output flow to the heat load;
a second liquid refrigerant distribution unit coupled to the second evaporator coil to form a second fluid circuit;
a water circuit in thermal communication with the first fluid circuit through a first condenser; and a first compressor circuit in thermal communication with the second fluid circuit through a second condenser and in thermal communication with the water circuit through a third condenser,
wherein the water circuit has a closed loop in which water flows through the first condenser and the third condenser, and
wherein the first compressor circuit has a closed loop in which refrigerant flows through the second condenser and the third condenser.

2. The cooling system according to claim 1, wherein the first evaporator coil is a primary evaporator coil and the second evaporator coil is a secondary evaporator coil.

3. The cooling system according to claim 1, further comprising a second compressor circuit in thermal communication with the first fluid circuit.

4. The cooling system according to claim 3, wherein the first fluid circuit is in thermal communication with the second compressor circuit through a refrigerant-to-refrigerant heat exchanger.

5. The cooling system according to claim 3, wherein the first fluid circuit includes the first condenser in thermal communication with the water circuit, and
wherein the second compressor circuit includes the second condenser in thermal communication with the water circuit.

6. The cooling system according to claim 1, wherein the first fluid circuit, the second fluid circuit, and the first compressor circuit are configured to circulate refrigerants.

7. A cooling system comprising: a first evaporator coil in thermal communication with an air intake flow to a heat load; a first liquid refrigerant distribution unit coupled to the first evaporator coil to form a first fluid circuit; a second evaporator coil disposed in series with the first evaporator coil in the air intake flow to the heat load and in thermal communication with the air intake flow to the heat load; a second liquid refrigerant distribution unit coupled to the second evaporator coil to form a second fluid circuit; a first cooling circuit in thermal communication with the first fluid circuit through a first condenser; and a second cooling circuit in thermal communication with the second fluid circuit through a second condenser and in thermal communication with the first cooling circuit through a third condenser, wherein the first cooling circuit has a closed loop in which water flows through the first condenser and the third condenser, and wherein the second cooling circuit has a closed loop in which refrigerant flows through the second condenser and the third condenser.

8. The cooling system according to claim 7, wherein the first evaporator coil is a primary evaporator coil and the second evaporator coil is a secondary evaporator coil.

9. The cooling system according to claim 7, further comprising a compressor circuit in thermal communication with the first fluid circuit.

10. The cooling system according to claim 9, wherein the first fluid circuit, the second fluid circuit, and the compressor circuit are configured to circulate refrigerants.

* * * * *